(12) United States Patent
Lin et al.

(10) Patent No.: US 8,263,501 B2
(45) Date of Patent: Sep. 11, 2012

(54) SILICON DIOXIDE FILM FABRICATING PROCESS

(75) Inventors: Chien-Liang Lin, Taoyuan County (TW); Yu-Ren Wang, Tainan (TW); Ying-Wei Yen, Miaoli County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 12/968,606

(22) Filed: Dec. 15, 2010

(65) Prior Publication Data

US 2012/0156891 A1    Jun. 21, 2012

(51) Int. Cl.
*H01L 21/31* (2006.01)
*H01L 21/469* (2006.01)

(52) U.S. Cl. ........ 438/773; 438/770; 438/775; 438/786; 438/594; 257/E21.282; 257/E21.283; 257/E21.284; 257/E21.285

(58) Field of Classification Search .......... 438/770, 438/773, 775, 786; 257/E21.282, E21.283, 257/E21.284, E21.285
See application file for complete search history.

(56) References Cited

U.S. PATENT DOCUMENTS

| | | | | |
|---|---|---|---|---|
| 5,360,769 | A | * 11/1994 | Thakur et al. | 438/762 |
| 6,165,846 | A | 12/2000 | Carns et al. | |
| 6,245,689 | B1 | 6/2001 | Hao et al. | |
| 6,410,456 | B1 | * 6/2002 | Gronet et al. | 438/769 |
| 2011/0018073 | A1 | * 1/2011 | Wang et al. | 257/411 |

* cited by examiner

*Primary Examiner* — Ha Tran T Nguyen
*Assistant Examiner* — Aaron Dehne
(74) *Attorney, Agent, or Firm* — Ding Yu Tan

(57) ABSTRACT

A silicon dioxide film fabricating process includes the following steps. Firstly, a substrate is provided. A rapid thermal oxidation-in situ steam generation process is performed to form a silicon dioxide film on the substrate. An annealing process is performed to anneal the substrate in a first gas mixture at a temperature in the range of 1000° C. to 1100° C.

12 Claims, 2 Drawing Sheets

SILICON DIOXIDE FILM FABRICATING PROCESS

FIELD OF THE INVENTION

The present invention relates to a silicon dioxide film fabricating process, and more particularly to a silicon dioxide film fabricating process applied to a semiconductor manufacturing process.

BACKGROUND OF THE INVENTION

In semiconductors, silicon dioxide films are widely used as insulating structures. For example, the gate insulator layers of metal-oxide-semiconductor (MOS) transistors or the floating gate insulator layers of electrically erasable programmable read-only memories (EEPROMs) are usually made of silicon dioxide. Recently, as the trend in designing integrated circuits is toward small-sized device dimensions, the thickness of the gate insulator layer is less than 100 angstroms. In other words, the electrical characteristics and the yield of the semiconductor components (e.g. transistors) are highly dependent on the quality of the silicon dioxide films. Conventionally, since the silicon dioxide film is formed on a silicon substrate by an oxidation furnace, the quality of the silicon dioxide film is usually unsatisfied.

Therefore, there is a need of providing a silicon dioxide film fabricating process to obviate the drawbacks encountered from the prior art.

SUMMARY OF THE INVENTION

Therefore, the object of the present invention is to provide a process for fabricating a silicon dioxide film with enhanced quality.

In accordance with an aspect, the present invention provides a silicon dioxide film fabricating process. Firstly, a substrate is provided. A rapid thermal oxidation-in situ steam generation process is performed to form a silicon dioxide film on the substrate. An annealing process is performed to anneal the substrate in a first gas mixture at a temperature in the range of 1000° C. to 1100° C.

In an embodiment, the substrate is a silicon wafer, and the rapid thermal oxidation-in situ steam generation process is performed in a second gas mixture of a hydrogen gas and an oxygen gas at a temperature in the range of 850° C. to 1000° C.

In an embodiment, the rapid thermal oxidation-in situ steam generation process is performed is performed for a time period in the range of 10 seconds to 20 seconds, and a flow rate ratio of the hydrogen gas to the oxygen gas of the second gas mixture is 1:2.

In an embodiment, the silicon dioxide film has a thickness in the range of 45 angstroms to 55 angstroms.

In an embodiment, the annealing process is performed after the silicon dioxide film is formed on the substrate, and the annealing process is performed for a time period in the range of 10 seconds to 120 seconds.

In an embodiment, the first gas mixture comprises a nitrous oxide gas and a hydrogen gas, and a flow rate ratio of the hydrogen gas to the nitrous oxide gas of the first gas mixture is 1:100, wherein the annealing process is performed at a temperature of 1080° C. for a time period of 31 seconds.

In an embodiment, the first gas mixture comprises a nitrogen gas and a hydrogen gas, and a flow rate ratio of the hydrogen gas to the nitrogen oxide gas of the first gas mixture is 3:7, wherein the annealing process is performed at a temperature of 1100° C. for a time period of 60 seconds.

In an embodiment, the annealing process is performed before the silicon dioxide film is formed on the substrate, and the annealing process is performed for a time period in the range of 10 seconds to 120 seconds.

In an embodiment, the first gas mixture comprises a nitrous oxide gas and a hydrogen gas, and a flow rate ratio of the hydrogen gas to the nitrous oxide gas of the first gas mixture is 1:100, wherein the annealing process is performed at a temperature of 1080° C. for a time period of 31 seconds.

In an embodiment, the first gas mixture comprises a nitrogen gas and a hydrogen gas, and a flow rate ratio of the hydrogen gas to the nitrogen oxide gas of the first gas mixture is 3:7, wherein the annealing process is performed at a temperature of 1100° C. for a time period of 60 seconds.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
FIGS. 1A, 1B and 1C are schematic views illustrating a silicon dioxide film fabricating process according to a first embodiment of the present invention.
Figure 1B:
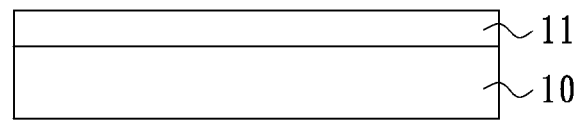
Figure 1C:
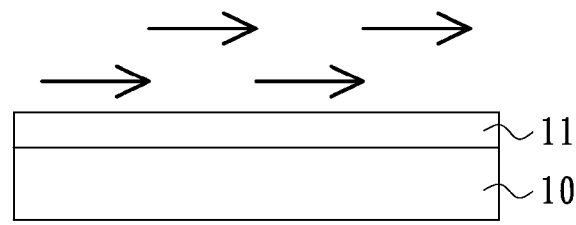

The present invention provides a silicon dioxide film fabricating process for fabricating a silicon dioxide film with good properties. FIGS. 1A, 1B and 1C are schematic views illustrating a silicon dioxide film fabricating process according to a first embodiment of the present invention. First of all, as shown in FIG. 1A, a substrate 10 is provided. An example of the substrate 10 is a silicon wafer. Then, a rapid thermal oxidation-in situ steam generation (RTO-ISSG) process is performed to form a silicon dioxide film 11 on the substrate 10 (see FIG. 1B). During the RTO-ISSG process is performed, a gas mixture of a hydrogen gas at a flow rate of 10 liters/minute and an oxygen gas at a flow rate of 20 liters/minute (i.e. the flow rate ratio of hydrogen to oxygen is 1:2) is introduced into a reaction chamber at a temperature in the range of 850° C. to 1000° C. In addition, the RTO-ISSG process is performed for a time period in the range of 10 seconds to 20 seconds. In such way, the thickness of the silicon dioxide film 11 is controlled to be in the range of 45 angstroms to 55 angstroms.

For improving the property of the silicon dioxide film 11, the substrate 10 is annealed in a gas mixture of a reactant gas and an inert gas at a temperature in the range of 1000° C. to 1100° C. The annealing process is effective for damage recovery of the silicon dioxide film 11. The annealing process as shown in FIG. 1C is performed after the silicon dioxide film 11 is formed on the substrate 10. Consequently, this annealing process may be also referred as a post-annealing process. The post-annealing process is performed for a time period in the range of 10 seconds to 120 seconds. The reactant gas of the gas mixture used in the post-annealing process is for example hydrogen or oxygen. The inert gas of the gas mixture used in the post-annealing process is for example nitrous oxide (N2O) or nitrogen (O2).

In an example, during the post-annealing process is performed, a gas mixture of a hydrogen gas (i.e. the reactant gas) at a flow rate of 0.15 liters/minute and a nitrous oxide gas (i.e. the inert gas) at a flow rate of 15 liters/minute (i.e. the flow rate ratio of hydrogen to nitrous oxide is 1:100) is introduced into a reaction chamber at a temperature of 1080° C. for a time period of 31 seconds. By the post-annealing process, the quality of the silicon dioxide film 11 is enhanced, and the electrical characteristics of the semiconductor component (e.g. a transistor) with such silicon dioxide film are largely improved. Experiments demonstrate that the negative bias temperature instability (NBTI), the time-to-breakdown value at 63.2% failure (TBD_63.2%) and other semiconductor reliability parameters are considerably improved. The measuring result is listed in Table 1 (see Condition 2).

In another example, during the post-annealing process is performed, a gas mixture of an oxygen gas (i.e. the reactant gas) at a flow rate of 9 liters/minute and a nitrous oxide gas (i.e. the inert gas) at a flow rate of 21 liters/minute (i.e. the flow rate ratio of hydrogen to nitrous oxide is 3:7) is introduced into a reaction chamber at a temperature of 1100° C. for a time period of 60 seconds. Similarly, the quality of the silicon dioxide film is enhanced, and the electrical characteristics (e.g. NBTI and TBD_63.2%) of the transistor with such silicon dioxide film are largely improved. The measuring result is listed in Table 1 (see Condition 4).

Figure 2A:
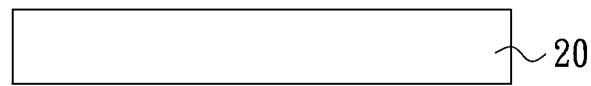
FIGS. 2A, 2B and 2C are schematic views illustrating a silicon dioxide film fabricating process according to a second embodiment of the present invention.
Figure 2B:
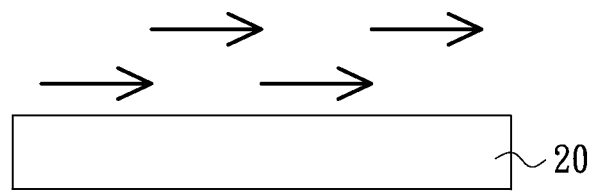
Figure 2C:
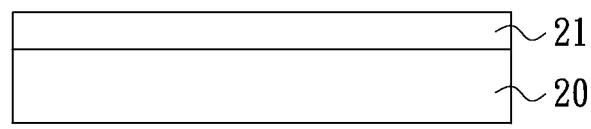

FIGS. 2A, 2B and 2C are schematic views illustrating a silicon dioxide film fabricating process according to a second embodiment of the present invention. First of all, as shown in FIG. 2A, a substrate 20 is provided. An example of the substrate 20 is a silicon wafer. Since the substrate 20 is processed by a dopant implantation process before the gate insulator layer is formed, the charge accumulated on the substrate 20 may affect the growth rate of subsequent formation of the silicon dioxide film. For solving this problem, before the silicon dioxide film is formed on the substrate 20, an annealing process is performed (see FIG. 2B). This annealing process is also referred as a pre-annealing process. The pre-annealing process is performed for a time period in the range of 10 seconds to 120 seconds. Then, a rapid thermal oxidation-in situ steam generation (RTO-ISSG) process is performed to form a silicon dioxide film 21 on the substrate 20 (see FIG. 2C). Similarly, during the RTO-ISSG process is performed, a gas mixture of a hydrogen gas at a flow rate of 10 liters/minute and an oxygen gas at a flow rate of 20 liters/minute (i.e. the flow rate ratio of hydrogen to oxygen is 1:2) is introduced into a reaction chamber at a temperature in the range of 850° C. to 1000° C. In addition, the RTO-ISSG process is performed for a time period in the range of 10 seconds to 20 seconds. In such way, the thickness of the silicon dioxide film 21 is controlled to be in the range of 45 angstroms to 55 angstroms.

In addition, the pre-annealing process is performed in a gas mixture of a reactant gas and an inert gas. The reactant gas of the gas mixture used in the pre-annealing process is for example hydrogen or oxygen. The inert gas of the gas mixture used in the pre-annealing process is for example nitrous oxide or nitrogen.

In an example, during the pre-annealing process is performed, a gas mixture of a hydrogen gas (i.e. the reactant gas) at a flow rate of 0.15 liters/minute and a nitrous oxide gas (i.e. the inert gas) at a flow rate of 15 liters/minute (i.e. the flow rate ratio of hydrogen to nitrous oxide is 1:100) is introduced into a reaction chamber at a temperature of 1080° C. for a time period of 31 seconds. By the pre-annealing process, the quality of the silicon dioxide film 21 is enhanced, and the electrical characteristics of the semiconductor component (e.g. a transistor) with such silicon dioxide film are largely improved. Experiments demonstrate that the negative bias temperature instability (NBTI), the time-to-breakdown value at 63.2% cumulative failure (TBD_63.2%) and other semiconductor reliability parameters are considerably improved. The measuring result is listed in Table 1 (see Condition 5).

In another example, during the pre-annealing process is performed, a gas mixture of an oxygen gas (i.e. the reactant gas) at a flow rate of 9 liters/minute and a nitrous oxide gas (i.e. the inert gas) at a flow rate of 21 liters/minute (i.e. the flow rate ratio of hydrogen to nitrous oxide is 3:7) is introduced into a reaction chamber at a temperature of 1100° C. for a time period of 60 seconds. Similarly, the quality of the silicon dioxide film is enhanced, and the electrical characteristics (e.g. NBTI and TBD_63.2%) of the transistor with such silicon dioxide film are largely improved. The measuring result is listed in Table 1 (see Condition 6).

TABLE 1

| | Formation of silicon dioxide film | Annealing condition | TBD (63.2%) | NBTI |
|---|---|---|---|---|
| Condition 1 | ISSG, 53 Å, flow rate ratio H2/O2 = 1:2, 18.8 s, 1000° C. | No annealing | 86 | Baseline |
| Condition 2 | ISSG, 53 Å, flow rate ratio H2/O2 = 1:2, 18.8 s, 1000° C. | Post-annealing, flow rate ratio H2/N2O = 1:100, 31 s, 1080° C. | 168 | ~4.9X |
| Condition 3 | ISSG, 53 Å, flow rate ratio H2/O2 = 1:2, 18.8 s, 1000° C. | Post-annealing, flow rate ratio O2/N2 = 3:7, 60 s, 1000° C. | 112 | Baseline |
| Condition 4 | ISSG, 51 Å, flow rate ratio H2/O2 = 1:2, 16 s, 1000° C. | Post-annealing, flow rate ratio O2/N2 = 3:7, 60 s, 1100° C. | 118 | ~4.9X |
| Condition 5 | ISSG, 51 Å, flow rate ratio H2/O2 = 1:2, 16 s, 1000° C. | Pre-annealing, flow rate ratio H2/N2O = 1:100, 31 s, 1050° C. | 173 | ~2.45X |
| Condition 6 | ISSG, 49 Å, flow rate ratio H2/O2 = 1:2, 13.3 s, 1000° C. | Pre-annealing, flow rate ratio O2/N2 = 3:7, 60 s, 1100° C. | 90 | Baseline |
| Condition 7 | Furnace dry oxide (O2), 54 Å | No annealing | 10 | Baseline |

As shown in Table 1, the conditions 1 and 7 are used to fabricate the silicon dioxide films according to the prior art, but the conditions 2, 3, 4, 5 and 6 are used to fabricate the silicon dioxide films according to the present invention. In comparison with the prior art, the silicon dioxide films produced by the fabricating process of the present invention have better quality in NBTI and/or TBD_63.2%. Therefore, the silicon dioxide film fabricating process according to the present invention is effective to obviate the drawbacks encountered from the prior art.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A silicon dioxide film fabricating process, comprising:
providing a substrate;

performing a pre-annealing process to anneal the substrate in a first gas mixture at a temperature in the range of 1000° C. to 1100° C., wherein the first gas mixture comprises a nitrous oxide gas and a hydrogen gas;

performing a rapid thermal oxidation-in situ steam generation process to form a silicon dioxide film on the substrate, wherein the rapid thermal oxidation-in situ steam generation process is performed after the pre-annealing process; and performing a post-annealing process after the silicon dioxide film is formed to anneal the silicon dioxide film in the first gas mixture.

2. The silicon dioxide film fabricating process according to claim 1, wherein the substrate is a silicon wafer, and the rapid thermal oxidation-in situ steam generation process is performed in a second gas mixture of a hydrogen gas and an oxygen gas at a temperature in the range of 850° C. to 1000° C.

3. The silicon dioxide film fabricating process according to claim 2, wherein the rapid thermal oxidation-in situ steam generation process is performed is performed for a time period in the range of 10 seconds to 20 seconds, and a flow rate ratio of the hydrogen gas to the oxygen gas of the second gas mixture is 1:2.

4. The silicon dioxide film fabricating process according to claim 1, wherein the silicon dioxide film has a thickness in the range of 45 angstroms to 55 angstroms.

5. The silicon dioxide film fabricating process according to claim 1, wherein the post-annealing process is performed for a time period in the range of 10 seconds to 120 seconds.

6. The silicon dioxide film fabricating process according to claim 5, wherein a flow rate ratio of the hydrogen gas to the nitrous oxide gas of the first gas mixture is 1:100, wherein the annealing process is performed at a temperature of 1080° C. for a time period of 31 seconds.

7. The silicon dioxide film fabricating process according to claim 5, wherein a flow rate ratio of the hydrogen gas to the nitrogen oxide gas of the first gas mixture is 3:7, wherein the annealing process is performed at a temperature of 1100° C. for a time period of 60 seconds.

8. The silicon dioxide film fabricating process according to claim 1, wherein the pre-annealing process is performed for a time period in the range of 10 seconds to 120 seconds.

9. The silicon dioxide film fabricating process according to claim 8, wherein a flow rate ratio of the hydrogen gas to the nitrous oxide gas of the first gas mixture is 1:100, wherein the annealing process is performed at a temperature of 1080° C. for a time period of 31 seconds.

10. The silicon dioxide film fabricating process according to claim 8, wherein a flow rate ratio of the hydrogen gas to the nitrogen oxide gas of the first gas mixture is 3:7, wherein the annealing process is performed at a temperature of 1100° C. for a time period of 60 seconds.

11. The silicon dioxide film fabricating process according to claim 1, wherein the pre-annealing process and the post-annealing process are performed without changing a thickness and a composition of the substrate.

12. The silicon dioxide film fabricating process according to claim 1, wherein the substrate is a silicon wafer.

* * * * *